(12) United States Patent
Sakamoto et al.

(10) Patent No.: US 10,263,166 B2
(45) Date of Patent: Apr. 16, 2019

(54) LIGHT EMITTING DEVICE

(71) Applicant: NICHIA CORPORATION, Anan-shi, Tokushima (JP)

(72) Inventors: Masakazu Sakamoto, Tokushima (JP); Yoshiki Sato, Anan (JP); Yasuo Kato, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/943,432

(22) Filed: Apr. 2, 2018

(65) Prior Publication Data

US 2018/0226550 A1  Aug. 9, 2018

Related U.S. Application Data

(63) Continuation of application No. 14/332,274, filed on Jul. 15, 2014, now Pat. No. 9,966,513.

(30) Foreign Application Priority Data

Jul. 17, 2013  (JP) .................................. 2013-148331

(51) Int. Cl.
*H01L 33/44* (2010.01)
*H01L 33/60* (2010.01)
*H01L 33/62* (2010.01)

(52) U.S. Cl.
CPC .............. *H01L 33/60* (2013.01); *H01L 33/44* (2013.01); *H01L 33/62* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/48257* (2013.01); *H01L 2224/8592* (2013.01); *H01L 2924/00011* (2013.01); *H01L 2924/01005* (2013.01)

(58) Field of Classification Search
CPC ......................................................... H01L 33/60
USPC ..................................................... 362/296.04
See application file for complete search history.

(56) References Cited

U.S. PATENT DOCUMENTS 5,509,200 A  4/1996  Frankeny et al.
2008/0054287 A1*  3/2008  Oshio .................... H01L 33/60
257/99

(Continued)

FOREIGN PATENT DOCUMENTS

JP  2007-324256 A  12/2007
JP  2009-224536 A  10/2009

(Continued)

OTHER PUBLICATIONS

Notification of Reasons for Refusal issued in Japanese Patent Application No. 2013-148331 dated Mar. 1, 2017.

(Continued)

*Primary Examiner* — William J Carter
(74) *Attorney, Agent, or Firm* — Foley & Lardner LLP

(57) ABSTRACT

A light emitting device includes a light emitting element; a light reflecting member having an Ag-containing layer on a surface thereof; and a protective film having a thickness of 1 nm to 300 nm and covering a surface of the light reflecting member, the protective film covering a surface of the light reflecting member, in which the Ag-containing layer has a thickness of 0.1 μm to 0.5 μm.

20 Claims, 7 Drawing Sheets

(56) References Cited

U.S. PATENT DOCUMENTS

| | | | |
|---|---|---|---|
| 2008/0118651 A1* | 5/2008 | Brand | C09D 183/16 427/409 |
| 2009/0010017 A1 | 1/2009 | Hayashi et al. | |
| 2009/0014732 A1* | 1/2009 | Nishida | H01L 25/0753 257/88 |
| 2010/0193822 A1* | 8/2010 | Inobe | H01L 33/54 257/98 |
| 2010/0320493 A1 | 12/2010 | Suzuki | |
| 2012/0049225 A1* | 3/2012 | Wakaki | H01L 33/44 257/98 |
| 2012/0168810 A1 | 7/2012 | Kobayashi et al. | |

FOREIGN PATENT DOCUMENTS

| | | |
|---|---|---|
| JP | 2011-003777 A | 1/2011 |
| JP | 2011-071471 A | 4/2011 |
| JP | 2012-069539 A | 4/2012 |
| JP | 2012-089830 A | 5/2012 |
| JP | 2012-162775 A | 8/2012 |
| JP | 2013-089834 A | 5/2013 |
| WO | WO-2011/004711 A1 | 1/2011 |

OTHER PUBLICATIONS

Non-Final Office Action issued in U.S. Appl. No. 14/332,274 dated Jun. 1, 2016.

Final Office Action issued in U.S. Appl. No. 14/332,274 dated Nov. 17, 2016.

Non-Final Office Action issued in U.S. Appl. No. 14/332,274 dated May 3, 2017.

Notice of Allowance issued in U.S. Appl. No. 14/332,274 dated Jan. 3, 2018.

* cited by examiner

| | A | B |
|---|---|---|
| Example 1<br>Ag-containing film<br>0.1 μm thickness |  |  |
| Example 2<br>Ag-containing film<br>0.5 μm thickness |  |  |
| Comparative Example 1<br>Ag-containing film<br>1.0 μm thickness |  |  |
| Comparative Example 2<br>Ag-containing film<br>2.0 μm thickness |  |  |
| Comparative Example 3<br>Ag-containing film<br>3.0 μm thickness |  |  |

Fig. 6

| | Thickness (μm) of Ag-containing film | Luminous flux (lm) before test | Luminous flux (lm) after test | Luminous flux retention rate(%) |
|---|---|---|---|---|
| Example 1 | 0.1 | 118.8 | 95.9 | 80.7 |
| Example 2 | 0.5 | 121.7 | 93.7 | 77.0 |
| Comparative Example 1 | 1.0 | 123.5 | - | - |
| Comparative Example 2 | 1.5 | 123.1 | - | - |
| Comparative Example 3 | 2.0 | 124.0 | 65.5 | 52.9 |
| Comparative Example 4 | 3.0 | 123.9 | 62.5 | 50.5 |

LIGHT EMITTING DEVICE

CROSS-REFERENCE TO RELATED APPLICATIONS

This application is a continuation of U.S. patent application Ser. No. 14/332,274, filed on Jul. 15, 2014, which claims priority to Japanese Patent Application No. 2013-148331, filed on Jul. 17, 2013, the disclosures of which are hereby incorporated by reference in their entireties.

BACKGROUND OF THE INVENTION

1. Field of the Invention

The present disclosure relates to a light emitting device including a light reflecting member having an Ag-containing layer.

2. Description of Related Art

In a light emitting device including a semiconductor light emitting element (hereinafter, also referred to simply as a "light emitting element"), various types of packages are employed in which silver (Ag) having a high reflectance to light from the light emitting element is provided on the outermost surface. However, Ag reacts (is sulfurated) easily under an atmosphere where a sulfur-containing gas exists, and consequently discoloration and corrosion occur, resulting in significant deterioration of characteristics of the light emitting device, such as a reduction in reflectance. Thus, attempts have been made with covering the surface of Ag with a protective film made from an inorganic material such as glass or silica (e.g. JP 2007-324256 A and JP 2009-224536 A).
in thermal expansion coefficient between a member having Ag or a resin and the protective film. Discoloration and corrosion of Ag may easily occur due to ingress of a sulfur-containing gas from a portion where the protective film is broken.

It is very difficult to fully cover Ag with a protective film, and gaps such as pinholes may occur in the protective film. Discoloration and corrosion of Ag may also occur from those portions that are not covered with the protective film.

SUMMARY

A light emitting device according to the present disclosure includes a light emitting element, a light reflecting member or a light reflector having an Ag-containing layer on a surface thereof, and a protective film having a thickness of 1 nm to 300 nm and covering a surface of the light reflecting member, in which the Ag-containing layer has a thickness of 0.1 μm to 0.5 μm.

According to the above-mentioned configuration, discoloration and corrosion of Ag can be suppressed to provide a light emitting device which is resistant to a reduction in reflectance and thus has high reliability.

BRIEF DESCRIPTION OF THE DRAWINGS

FIG. 6 is a chart showing sulfuration test results for light emitting devices of one embodiment of the present invention and light emitting devices of comparative examples.

DETAILED DESCRIPTION OF EMBODIMENT

Figure 1A:
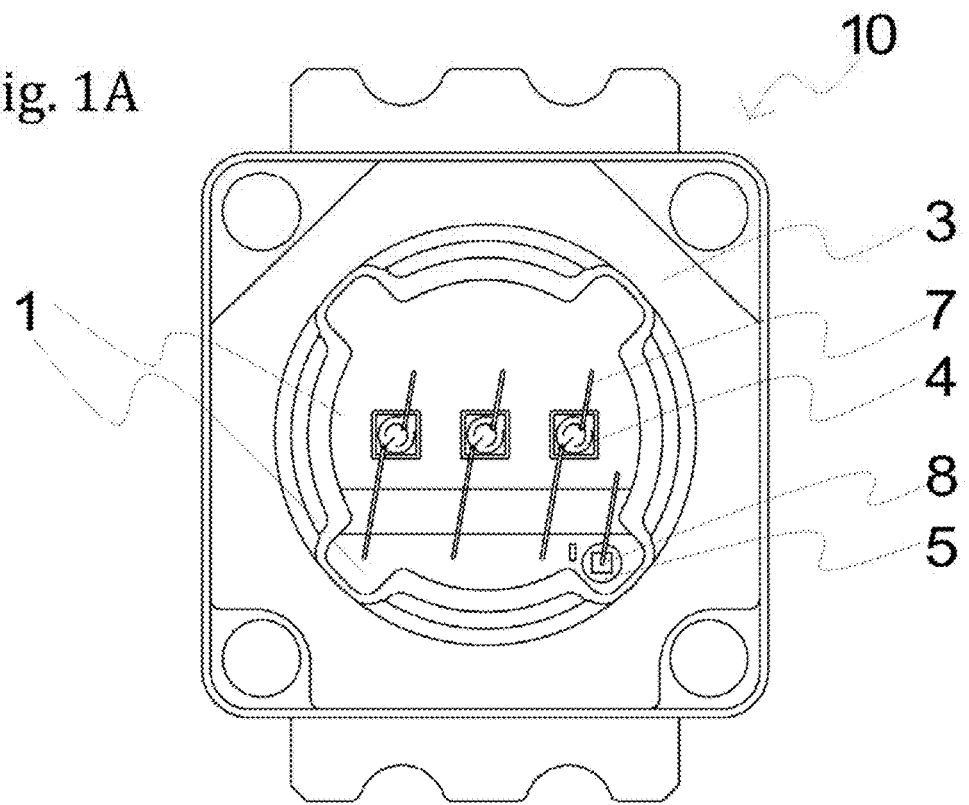
FIG. 1A shows a schematic plan view.

An embodiment of the present invention will be described below with reference to the drawings. However, the embodiment shown below is intended to illustrate a light emitting device and a method for producing the light emitting device for embodying the technical concept of the present invention, and is not intended to limit the present invention to the following. Unless otherwise specified, the dimensions, materials, shapes, relative arrangements etc. of the components described in the embodiment are not intended to limit the scope of the present invention thereto, but are merely illustrative. The sizes, positional relationships etc. of the members shown in the drawings may be exaggerated for making explanations clear.

Figure 1B:
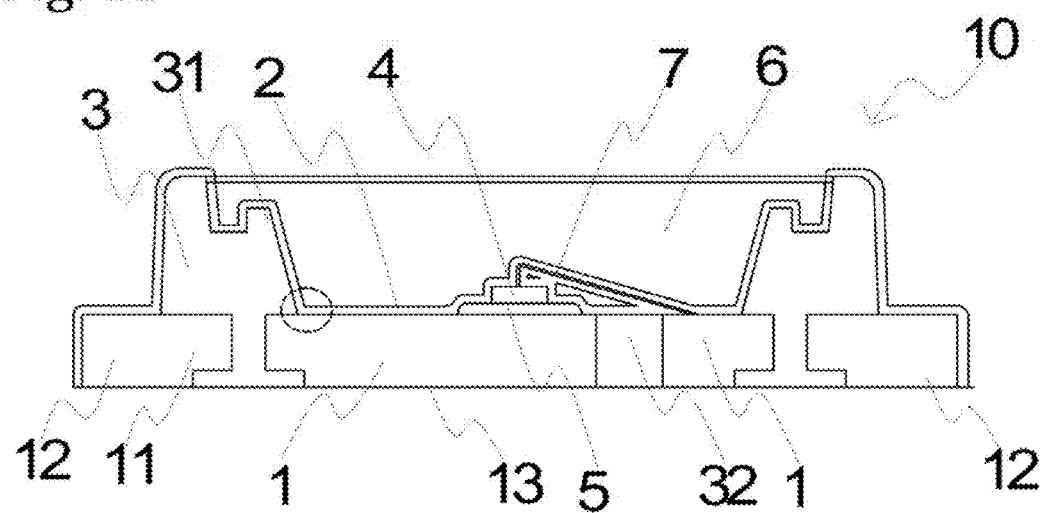
FIG. 1B shows a schematic sectional view, for explaining a light emitting device of one embodiment.

FIG. 1 shows a structure of a light emitting device 10 of this embodiment. The light emitting device 10 of this embodiment includes three light emitting elements 4 that are rectangular in a plan view, a pair of flat plate-shaped light reflecting members 1 each having an Ag-containing layer on a surface thereof, and a protective film 2 formed by an atomic layer deposition method, the protective film 2 covering surfaces of the light reflecting members 1, and the Ag-containing layer has a thickness of 0.1 μm to 0.5 μm. More specifically, the light emitting elements 4 are bonded onto one of the light reflecting members 1 via a bonding member 5, and positive/negative electrodes provided on the upper surfaces of the light emitting elements 4 and the pair of light reflecting members 1 are each connected through two wires 7. Further, the light emitting device 10 includes a resin compact 3 that is approximately square in a plan view with the light reflecting member 1 partially embedded therein. The resin compact 3 has a recess portion that is approximately circular in a plan view with the light reflecting member 1 exposed at the bottom surface thereof. As shown in FIG. 1B, the protective film 2 covers the surface of an Ag-containing layer 1c exposed from the resin compact 3, the light emitting elements 4, the wires 7 and the surface of the resin compact 3. The light emitting device 10 has a sealing member 6 filled in the recess portion of the resin compact 3 so as to cover the protective film 2.

The components of the light emitting device of this embodiment will be described in detail below.

Light Reflecting Member 1

The light reflecting member 1 is a member to reflect light from the light emitting elements 4, has the Ag-containing layer 1c on a surface thereof, and is provided in the light emitting device 10 to reflect light emitted from the light emitting elements 4 and/or the later-described wavelength conversion member.

The light reflecting member 1 may be used in any appropriate form in the light emitting device 10. For example, the light reflecting member 1 may be provided below the light emitting elements 4 as in this embodiment, or may be provided in the form of a reflector surrounding the light emitting elements 4. The light reflecting member 1 may be a lead frame, or may be wiring formed on a board. The light reflecting member 1 may also serve as a mounting member for mounting the light emitting elements 4, a heat dissipation member for dissipating heat, and a conductive member that is electrically connected to the light emitting element. Thus, the light reflecting member 1 preferably has good heat dissipation, good electrical conductivity and good wire bonding quality according of the functions thereof.

In this embodiment, the light reflecting member 1 is formed in the shape of a pair of flat plates that are approximately y rectangular in a plan view as shown in FIGS. 1A and 1B. Further, the light reflecting member 1 serves as a mounting member on which three light emitting elements 4 are mounted, and as positive/negative conductive members to which the light emitting elements are each electrically connected through the two wires 7.

The material of the light reflecting member 1 is not particularly limited as long as the Ag-containing layer 1$c$ is provided on a surface thereof, and the light reflecting member 1 may have a base member 1$a$, an underlayer etc. as described below.

Figure 2:
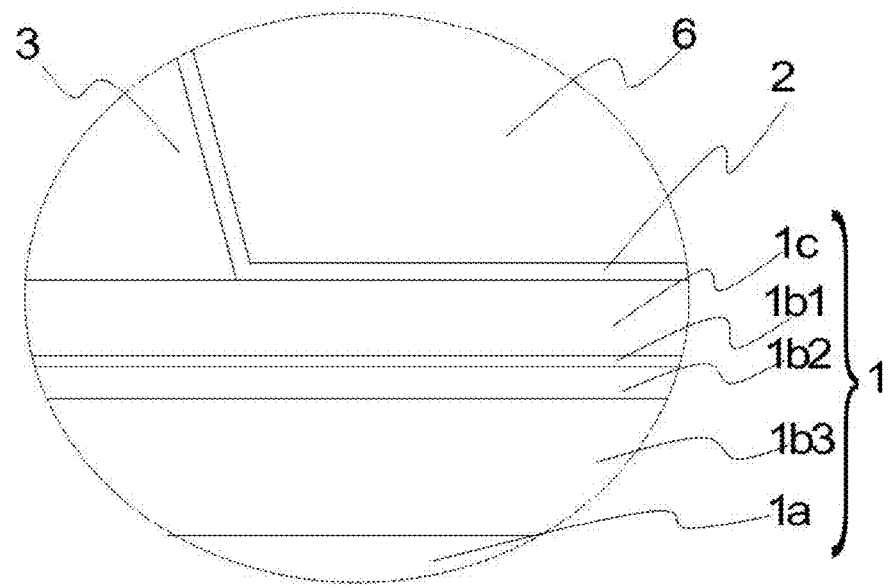
FIG. 2 is a schematic enlarged sectional view for explaining a configuration of the light emitting device in FIG. 1.

As shown in FIG. 2 which is an enlarged view of the part of FIG. 1B encircled by broken line, the light reflecting member 1 of this embodiment includes a first underlayer 1$b$1, a second underlayer 1$b$2, a third underlayer 1$b$3 and the Ag-containing layer 1$c$ in this order, around the base member 1$a$, at the upper surface, the side surfaces and the bottom surface.

Ag-Containing Layer 1$c$

The Ag-containing layer 1$c$ is provided on a surface of the light reflecting member 1, and has a thickness of 0.1 μm to 0.5 μm. When the thickness of the Ag-containing layer 1$c$ is less than 0.1 μm, the light reflectance may be extremely reduced, so that the use of the Ag-containing layer 1$c$ as a material of the surface of the light reflecting member 1 becomes less advantageous. When the thickness is more than 0.5 μm, sulfuration may easily proceed as described below, and therefore such a thickness is not preferred.

The thickness of the Ag-containing layer 1$c$ is not particularly limited as long as it is between 0.1 μm and 0.5 μm, but the thickness is preferably 0.1 μm to 0.2 μm for preventing sulfuration. The thickness of the Ag-containing layer 1$c$ is preferably 0.3 μm to 0.5 μm for increasing the light reflectance.

The surface of the Ag-containing layer 1$c$ or the light reflecting member 1 preferably has a reflectance of 70% or more, especially preferably 80% or more to light having a wavelength in the visible light region. Light extraction efficiency can be thereby improved. The Ag-containing layer 1$c$ or the light reflecting member 1 preferably has high gloss, and the glossiness is preferably 0.5 or more, more preferably 1.0 or more, further preferably 1.6 or more. The glossiness mentioned here is a value obtained when light is applied at 45° and vertically received using Micro Surface Color-Difference Meter VSR 300A manufactured by NIPPON DENSHOKU INDUSTRIES Co., LTD.

As a material of the Ag-containing layer 1$c$, Ag alone, or an alloy of Ag and Au, Pt, Rh, Pd, Os, Ru, Sn, In, Zn, Te or the like can be used. When the material is an Ag alloy, the ratio of silver is preferably about 70% to 99%.

The Ag-containing layer 1$c$ is not required to be provided on the whole surface of the light reflecting member 1. That is, it suffices that at least a part of the surface of the light reflecting member 1 is the Ag-containing layer 1$c$. For example, in the light reflecting member 1, a portion which is not exposed at the bottom surface of the recess portion of the substrate 3 shown in FIG. 1, i.e. an embedded portion 11 embedded in the side wall portion of the resin compact 3, an external terminal portion 12 exposed at the outside of the resin compact 3, and a mounting portion 13 exposed on the bottom surface side of the light emitting device may not have the Ag-containing layer 1$c$ on their surfaces. For providing the Ag-containing layer 1$c$ on a part of the light reflecting member 1 as described above, a portion where the Ag-containing layer is not formed can be protected with a mask using a resist or a protective tape when a film is formed.

Base Member 1$a$

The light reflecting member 1 may include the base member 1$a$ in addition to the Ag-containing layer 1$c$ for various purposes.

The base member 1$a$ is used as a material for determining a rough shape of the light reflecting member 1.

As a material of the base member 1$a$, Cu, Fe, an alloy thereof, a clad material (e.g. a laminate of Cu/FeNi/Cu) etc. can be suitably used. Cu and alloys thereof have good heat dissipation, and therefore can be suitably used. Particularly, plate-shaped Cu and Cu alloys are preferred because they are also good in terms of mechanical characteristics, electric characteristics, processability and so on. The clad material is preferred because a clad material has lower linear expansion coefficient, so that the reliability of the light emitting device 10 is enhanced.

The thickness, shape etc. of the base member 1$a$ can be variously selected according to the shape etc. of the light emitting device 10. The base member 1$a$ can be in the shape of a plate, a block-like, a film or the like. Further, the base member 1$a$ may be a wiring pattern provided on ceramic etc. by printing etc., or may be a material obtained by plating the formed wiring pattern with Cu or an alloy thereof.

Underlayer 1$b$

A layer of a different material can be provided below the Ag-containing layer 1$c$ for various purposes.

It is preferred that a metal which hardly reacts with a sulfur component as compared to Ag is used for the underlayer 1$b$ of the Ag-containing layer. Specifically, Au, Au alloys, Pd, Pd alloys and so on are preferred. Particularly, an Au layer is preferred. The progress of sulfuration from below the Ag-containing layer can be suppressed, so that sulfuration of the Ag-containing layer 1$c$ can be suppressed.

It is preferred that a diffusion prevention layer is provided as the underlayer 1$b$ for preventing diffusion between the Ag-containing layer 1$c$ and a layer provided therebelow. Particularly, when Cu is used for the base member 1$a$, it is preferred that Ni, Pd and Au are sequentially stacked as the diffusion prevention layer. By employing such an arrangement, Cu in the base member 1$a$ can be suppressed from diffusing into the Ag-containing layer 1$c$ to suppress deterioration of adhesion and quality of the bonding of the wire.

The underlayer 1$b$ may be a layer that plays a role in both of sulfuration prevention and diffusion prevention. Costs can be thereby reduced. For example, Au can be suitably used as a layer provided immediately below the Ag-containing layer 1$c$ because Au hardly reacts with a sulfur component and has high diffusion prevention effect.

It is preferred that layers such as the Ag-containing layer 1$c$ and the underlayer 1$b$ are formed by plating. When the light reflecting member has the base member 1$a$, it is preferred that the base member 1$a$ is pretreated before plating is performed. Examples of the pretreatment include acid treatments with dilute sulfuric acid, dilute nitric acid, dilute hydrochloric acid and the like, and alkali treatments with sodium hydroxide and the like. As the pretreatment, the same treatment or a combination of different treatments may be performed once or several times. When the pretreatment is performed several times, it is preferred that washing with flowing water is performed using pure water after each treatment. Dilute sulfuric acid is preferred when the base member 1a is a metal plate composed of Cu or an alloy containing Cu, and dilute hydrochloric acid is preferred when the base member 1a is a metal plate composed of Fe or an alloy containing Fe.

When the Ag-containing layer 1c is formed by electroplating, the glossiness can be improved by using a brightening agent such as a Se-based brightening agent, a Sb-based brightening agent, a S-based brightening agent or an organic brightening agent. When the brightening agent is used in a large amount, components of the brightening agent may be entrapped in the Ag-containing layer 1c to cause deterioration of corrosion resistance. However, in this embodiment, the underlayer 1b is formed before the Ag-containing layer 1c is plated, and film quality thereof is controlled, so that a high level of glossiness can be achieved even when the used amount of the brightening agent is reduced. The light reflecting member 1 having good corrosion resistance while having a high glossiness can be thereby obtained.

The flatness of the base member 1a is preferably as high as possible for increasing the light reflectance of the light reflecting member 1. For example, the surface roughness Ra is preferably 0.5 µm or less. Thereby, the flatness of the underlayer 1b and the Ag-containing layer 1c provided on the base member 1a can be increased, and as in the present embodiment where the Ag-containing layer 1c that reflects light has a very small thickness of 0.1 µm to 0.5 µm, the light reflectance of the light reflecting member 1 can be satisfactorily increased. The flatness of the base member 1a can be increased by performing a treatment such as a rolling treatment or physical/chemical polishing.

Protective Film 2

The protective film 2 covers at least the Ag-containing layer 1c provided on a surface of the light reflecting member 1 so that principally prevents discoloration and corrosion of the Ag-containing layer 1c on a surface of the light reflecting member 1. Further, the protective film 2 may cover a surface of a member other than the light reflecting member 1, such as the light emitting element 4, the bonding member 5, the wire 7 or the substrate (resin compact 3), and a surface of the light reflecting member 1 which is not provided with the Ag-containing layer 1c.

In this embodiment, the protective film 2 is provided not only on surfaces of the Ag-containing layer 1c and the light reflecting member 1 but also continuously on surfaces of the light emitting elements 4, the bonding member 5, the wires 7, the resin compact 3 etc. The protective film 2 of this embodiment is continuously formed over surfaces of the members immediately after formation of the protective film 2. However, with passage through the subsequent involving temperature rising and falling in the production process, e.g. a sealing member forming step, cracks 2C may be generated at or near boundaries between members due to a difference in thermal expansion coefficient between the members, e.g. between the resin compact 3 and the light reflecting member 1, between the bonding member 5 and the light reflecting member 1, and between the wire 7 and the light reflecting member 1.

The protective film 2 of the present embodiment is formed by using an atomic layer deposition (hereinafter, also referred to as ALD) method. According to the ALD method, a very uniform protective film 2 can be formed, and sulfuration of the Ag-containing layer 1c can be very effectively prevented because the formed protective film 2 is denser than protective films obtained by other film formation methods.

Unlike the sputtering method, the ALD method is a method in which atomic layers of reaction components are formed one by one. Formation of the protective film 2 of aluminum oxide ($Al_2O_3$) using TMA (trimethylaluminum) and $H_2O$ will be described below.

First, a $H_2O$ gas is introduced into a chamber to form OH groups on a surface of an object to be covered. Next, an excessive gas is exhausted, and a TMA (trimethylaluminum) gas is then introduced into the chamber to react TMA with OH groups on the surface of the object to be covered with the protective film 2 (first reaction). Next, a $H_2O$ gas is introduced into the chamber to react $H_2O$ with TMA bound with OH groups (second reaction). Next, an excessive gas is exhausted, and the first reaction and the second reaction are repeated to form a dense aluminum oxide film having a desired thickness.

Examples of the material of the protective film 2 include, in addition to the above-mentioned $Al_2O_3$, oxides such as $SiO_2$, $TiO_2$, $ZrO_2$, $ZnO$, $Nb_2O_5$, $MgO$, $In_2O_3$, $Ta_2O_5$, $HfO_2$, $SeO$, $Y_2O_3$ and $SnO_2$, nitrides such as AlN, TiN and ZrN, and fluorides such as $ZnF_2$ and $SrF_2$. They may be used alone, or mixed and used. Alternatively, they may be stacked on one another.

The thickness of the protective film 2 is preferably about 1 nm to 300 nm, more preferably 5 nm to 100 nm although the preferred range somewhat varies depending on a material to be used. When a plurality of layers are stacked, it is preferred that the total thickness of the layers falls within the above-mentioned range.

It is preferred that the protective film 2 is formed after the wires 7 are provided. Thereby, sulfuration of the Ag-containing layer 1c around the wires 7 and resulting breakage of the wires 7 can be effectively reduced.

The effect of reducing sulfuration can be obtained as long as the protective film 2 covers at least a part of the surface of the Ag-containing layer 1c, but it is preferred that the protective film 2 covers substantially the entire surface of the Ag-containing layer 1c that reflects light of the light emitting device 10. For example, in the case where a recess portion is provided to house the light emitting elements 4 and the light reflecting member 1 is exposed at the bottom surface of the recess portion as in the light emitting device 10 shown in FIG. 1, it is preferred that the protective film 2 covers substantially the entire surface of the Ag-containing layer 1c exposed in the recess portion. Thereby, reliability of the light emitting device 10 can be enhanced while light extraction efficiency thereof is improved by the Ag-containing layer 1c.

Advantageous effects obtained by the configuration of the present embodiment will now be described.

FIGS. 3A through 3D and FIGS. 4A through 4D each show schematic views of sulfuration of the Ag-containing layer 1c covered with the protective film 2 formed by using an atomic layer deposition method. FIGS. 3A through 3D show a case where, as in an embodiment, the Ag-containing layer 1c is thin. FIGS. 4A through 4D show a case, as a comparative example, where the Ag-containing layer 1c is thick.

Figure 3A:
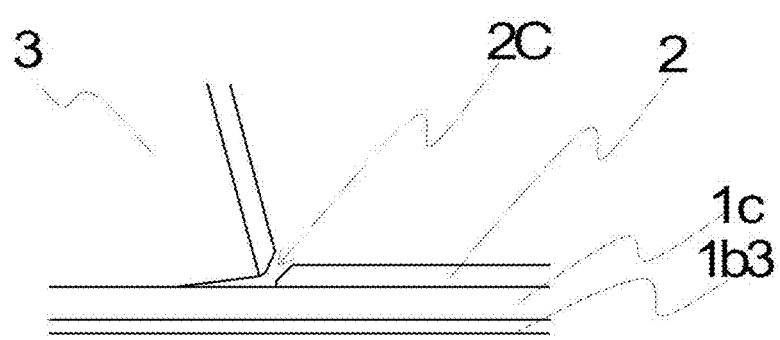
FIGS. 3A-3D shows schematic sectional views for explaining an effect of a light emitting device of one embodiment.
Figure 4A:
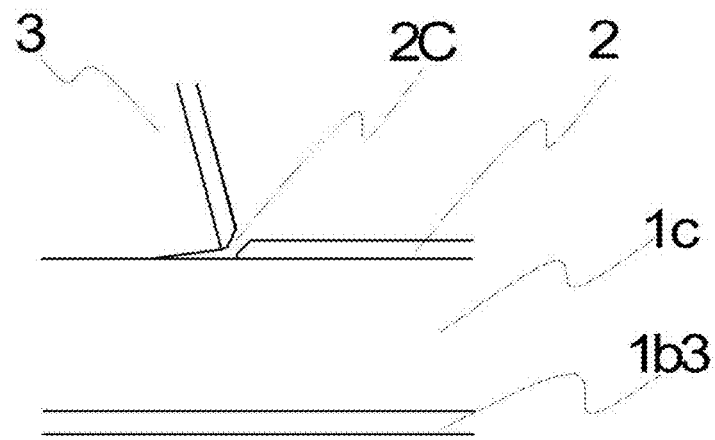
FIGS. 4A-4D show schematic sectional views of a light emitting device of a comparative example for explaining an effect of a light emitting device of one embodiment.

First, at a portion of the surface of the Ag-containing layer 1c which lacks the protective film 2 due to peeling between the resin compact 3 and the light reflecting member 1, crack 2C etc. (generated near the boundary between the resin compact 3 and the light reflecting member 1) as shown in FIGS. 3A and 4A, the Ag-containing layer 1c reacts with a sulfur-containing gas shown by the arrow, such as $S_8$ or $H_2S$, which initiates sulfuration of the Ag-containing layer 1c. As described above, the protective film 2 formed by using the atomic layer deposition method has a high effect of preventing sulfuration, and therefore sulfuration hardly occurs at a portion of the surface of the Ag-containing layer 1c where the protective film 2 is formed.

Figure 3B:
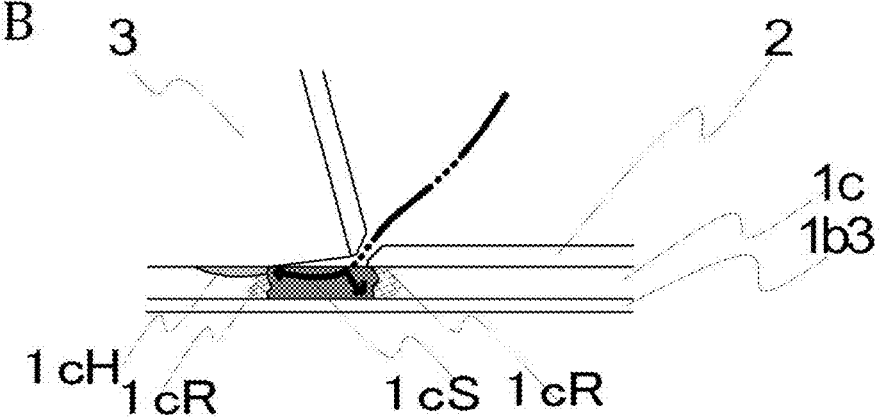
Figure 3C:
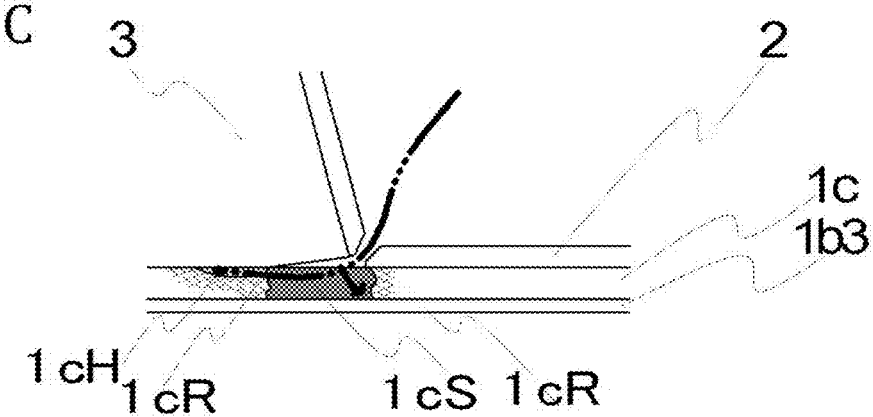
Figure 3D:
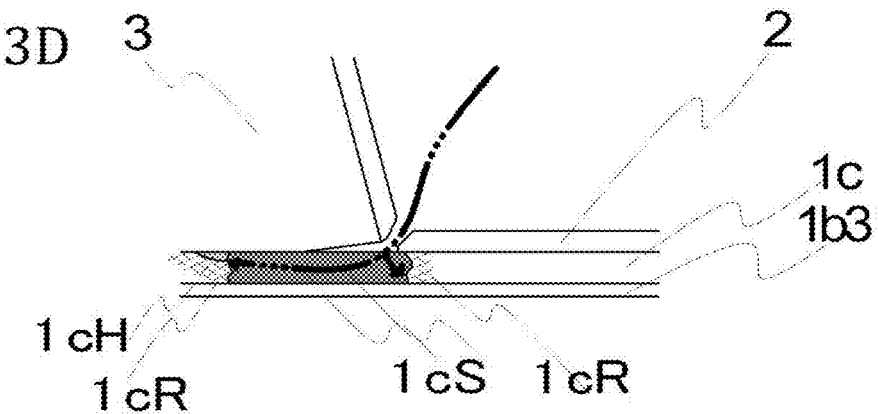

At this time, when the Ag-containing layer 1c is very thin as in the present invention, sulfuration occurs relatively rapidly in the thickness direction from the surface of the Ag-containing layer 1c, resulting in formation of silver sulfide 1cS as shown in FIG. 3B. In this case, subsequent sulfuration proceeds in the lateral direction (plane direction) of the Ag-containing layer 1c. Since the thickness of the Ag-containing layer 1c is small, the area of a portion is very small where the Ag-containing layer 1c and the sulfur-containing gas come into contact with each other to cause a sulfuration reaction (sulfuration reaction portion 1cR). Thereby, the progression of sulfuration can be considerably reduced. Accordingly, migration of Ag ions in the Ag-containing layer 1c which is caused by formation of silver sulfide 1cS decreases. Thus, cavitation of the Ag-containing layer 1c associated with migration of Ag ions, and expansion of the contact area between the Ag-containing layer 1c and the sulfur-containing gas due to ingress of the sulfur-containing gas into a cavity portion 1cH formed by the cavitation can be reduced (FIG. 3C). Thereby, the progression of sulfuration can be further reduced. Since the thickness of the Ag-containing layer 1c itself is small, the thickness of silver sulfide 1cS is also small, so that influences of blackening are insignificant even if sulfuration proceeds.

For the reason described above, in the present invention, a reduction in reflectance due to sulfuration of the Ag-containing layer 1c can be minimized.

Figure 4B:
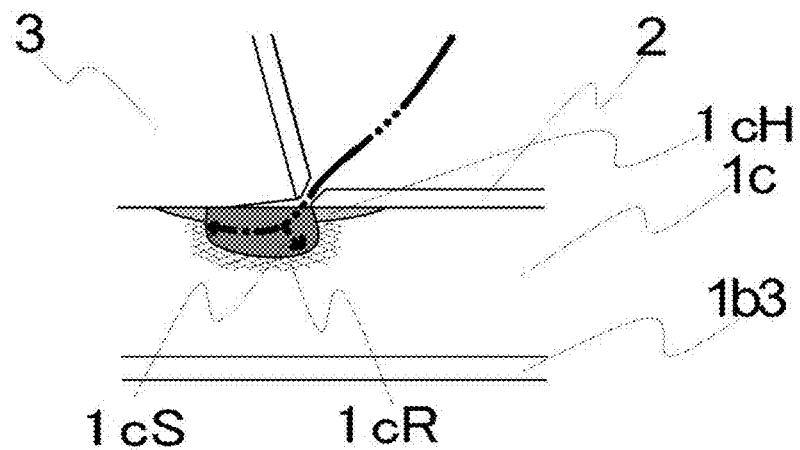
Figure 4C:
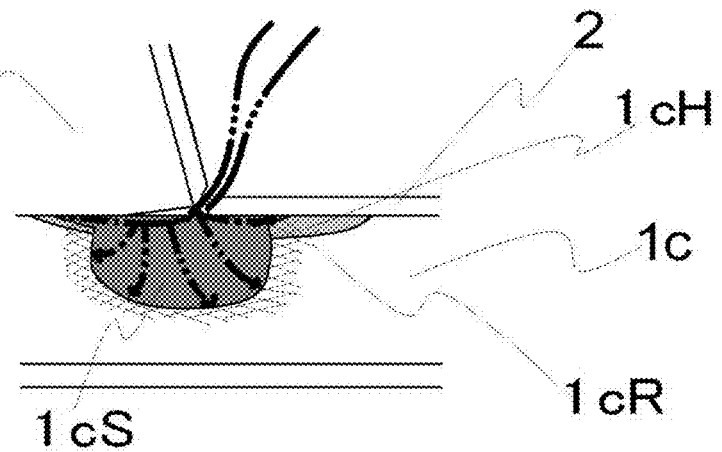
Figure 4D:
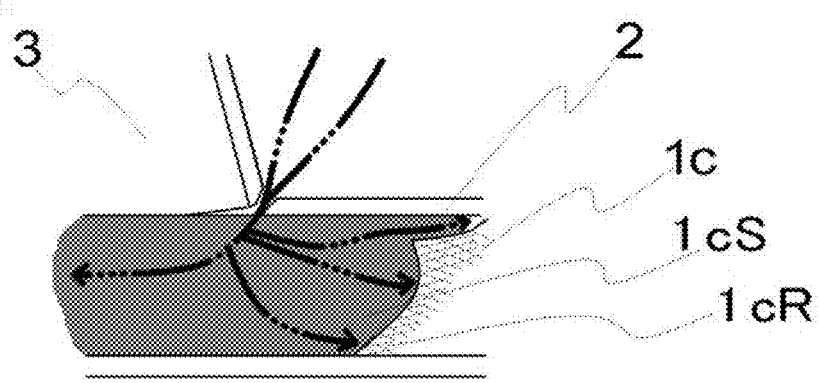

On the other hand, when the Ag-containing layer 1c is thick, the sulfuration reaction extensively proceeds in the thickness direction and plane direction of the Ag-containing layer 1c as shown in FIG. 4B. This is because since the thickness of the Ag-containing layer 1c is larger, the area of the Ag-containing layer 1c which contacts/reacts with the sulfur-containing gas in the thickness direction increases, so that sulfuration of Ag rapidly progresses. In addition, since the thickness of the Ag-containing layer 1c is large, Ag exists in a large amount, so that Ag ions are abundantly supplied to the sulfuration reaction portion 1cR. Accordingly, sulfuration further proceeds. A large number of cavity portions 1cH are easily generated in the Ag-containing layer 1c associated with supply/migration of Ag ions, and sulfuration of Ag further proceeds due to ingress of the sulfur-containing gas into the cavity portions 1cH (FIGS. 4C and 4D). For the reason described above, sulfuration of the Ag-containing layer 1c proceeds, leading to a reduction in reflectance.

That is, as in the present invention, when the protective film 2 is formed by the atomic layer deposition method in order to make the protective film 2 very dense, and the thickness of the Ag-containing layer 1c covered with the protective film 2 is 0.1 µm to 0.5 µm, the light emitting device 10 having both a proper light reflectance and proper reliability can be provided.

Light Emitting Element 4

As the light emitting element 4, a semiconductor light emitting element with an appropriate wavelength can be selected. For example, for the light emitting element 4 to emit blue and green light, a nitride-based semiconductor such as InGaN, GaN or AlGaN or one including GaP can be used. For the red light emitting element, GaAlAs, AlInGaP or the like can be used. Further, the light emitting element 4 composed of a material other than those described above can also be used. The composition, luminescent color, size, number, etc. of the light emitting element 4 to be used can be appropriately selected according to a purpose.

When a light emitting device 10 having a wavelength conversion member is provided, examples of the preferred light emitting element include nitride semiconductors capable of emitting light having a short wavelength which enables the wavelength conversion member to be efficiently excited. A light emission wavelength can be variously selected according to a material of the semiconductor layer and a degree of mixed crystal thereof. The light emitting element 4 that outputs not only light in the visible light region but also ultraviolet rays and infrared rays can be used.

It is preferred that the light emitting element 4 is mounted on the light reflecting member 1. Light extraction efficiency of the light emitting device 10 can be thereby improved.

The light emitting element 4 has positive/negative electrodes electrically connected to the conductive member. These positive/negative electrodes may be provided on one surface side, or may be provided on both upper and lower surfaces of the light emitting element 4. The method for connecting the electrodes to the conductive member is not particularly limited, and they may be connected by the wires 7 to be described below, or may be connected by flip-chip mounting.

As a member for fixing/mounting the light emitting element 4 on the light emitting device 10, the bonding member 5 can be used. As a preferred material, a conductive paste of silver, gold, palladium or the like, a eutectic solder material of Au—Sn, Sn—Ag—Cu or the like, a brazing material of a low-melting-point metal etc., a bond between the same materials using Cu, Ag and Au particles or films, or the like can be used for the conductive bonding member 5. For the insulating bonding member 5, an epoxy resin composition, a silicone resin composition, a polyimide resin composition or a modified resin thereof, a hybrid resin, or the like can be used. When the above-mentioned resin is used, a metal layer having a high reflectance, such as an Al film or an Ag film, or a dielectric reflective film can be provided on the mounting surface of the light emitting element 4 in consideration of degradation caused by light and heat from the light emitting element 4.

It is preferred that the light emitting element 4 is mounted on the Ag-containing layer 1c of the light reflecting member 1 because light extraction efficiency can be improved. In this case, cracks 2C may be formed in the protective film 2 on the periphery of the light emitting element 4 due to a difference in thermal expansion coefficient between the bonding member 5 and the light reflecting member 1, leading to sulfuration of the Ag-containing layer 1c in the vicinity of the light emitting element 4. However, by ensuring that the Ag-containing layer 1c has a very small thickness of 0.1 µm to 0.5 µm as in the present invention, the progression of sulfuration can be reduced and a reduction in light reflectance can be suppressed.

For supplying electricity to the light emitting element 4, an electrically conductive bonding member 5 can be connected to the electrode of the light emitting element 4, or alternatively the wire 7 can be used. The wires 7 can also be provided to connect a plurality of light emitting elements 4. As shown in FIG. 1A, each of the light emitting elements 4 may be provided with a wires 7 to connect to the respective leads.

When the wire 7 is connected to the light reflecting member 1, it is preferred that the protective film 2 is also provided on the surface of the wire 7. Thereby, disconnection between wire 7 and light reflecting member 1 due to sulfuration can be prevented and reliability of the light emitting device 10 can be enhanced. For the material of the wire 7, Au, Al, Cu or the like is suitably used. Ag or an Ag alloy having a high light reflectance may be used. In this case, it is preferred that the protective film 2 is provided so as to cover the wire 7. Thereby, sulfuration and breakage of the Ag wire can be prevented to enhance reliability of the light emitting device 10.

Substrate 3

The light emitting device 10 of the present invention may have the substrate 3.

The substrate 3 is, for example, a member for supporting or holding/fixing the light reflecting member 1.

Resin Compact

The light emitting device 10 of this embodiment includes the resin compact 3 as the substrate 3. The resin compact 3 is a member having as a base a resin that integrally holds a pair of light reflecting members 1. The shape of the substrate 3 in a plan view may be a substantially rectangular outer shape as shown in FIG. 1 as well as a shape such as a quadrangle, a polygon or a combination thereof. When the resin compact of the light emitting device 10 has a recess portion, the side wall portion of the recess portion is provided such that the inner surface thereof is inclined with respect to the bottom surface as shown in FIG. 1B. Alternatively, the inner surface may be substantially perpendicular to the bottom surface, or the side wall portion may have a step difference. The height thereof, the shape of the opening, etc. can be appropriately selected according to a purpose and a use. It is preferred that the light reflecting member 1 is provided in the recess portion. In this embodiment, the light reflecting member is provided on the bottom surface portion, but it may be provided on the side wall portion.

As the base of the resin compact 3, a thermosetting resin or a thermoplastic resin can be used, and particularly a thermosetting resin is preferably used. The thermosetting resin is preferably a resin having lower gas permeability as compared to a resin used for the sealing member 6, and specific examples thereof may include an epoxy resin composition, a silicone resin composition, a modified epoxy resin composition such as a silicone-modified epoxy resin, a modified silicone resin composition such as an epoxy-modified silicone resin, a polyimide resin composition, a modified polyimide resin composition, a urethane resin and a modified urethane resin composition. Preferably, fine particles etc. of $TiO_2$, $SiO_2$, $Al_2O_3$, $MgO$, $MgCO_3$, $CaCO_3$, $Mg(OH)_2$, $Ca(OH)_2$ or the like are mixed as a filler in the base of the resin compact 3 to adjust the transmittance of light so that about 60% or more, more preferably about 90% of light from the light emitting element can be reflected.

When the protective film 2 is formed after the light reflecting member 1 is embedded in the resin compact 3, the protective film 2 is not formed on the surface of an embedded part (embedded portion 11). Thus, if peeling etc. occurs between the resin compact 3 and the light reflecting member 1, the light reflecting member 1 which is not provided with the protective film 2 may be in contact with the sulfur-containing gas. Thereby, the Ag-containing layer 1c embedded in the resin compact 3 can be sulfurated, and the Ag-containing layer 1c at other portions can be prevented from being sulfurated.

The substrate 3 is not limited to the above-mentioned one having a resin as a base, and it may be formed of an inorganic substance such as ceramic, glass or metal. Thereby, there can be provided the light emitting device 10 which is hard to undergo degradation etc. and has high reliability.

Sealing Member 6

As shown in FIG. 1B, the light emitting device 10 of the present invention may include a sealing member 6. When the sealing member 6 is provided so as to cover members such as the light emitting element 4, the light reflecting member 1, the protective film 2 and the wire 7, the covered member can be protected from dust, moisture, external forces etc., so that reliability of the light emitting device 10 can be enhanced. Particularly, it is preferred that the sealing member 6 is provided on the protective film 2 after the protective film 2 is formed to protect the protective film 2, so that reliability of the light emitting device 10 is enhanced.

The sealing member 6 may be provided in any appropriate shape. The sealing member 6 may be provided so as to fill the inside of the recess portion of the resin compact 3 as in FIG. 1, or may be provided in the shape of a substantially hemispheric lens.

The sealing member 6 is preferably one having translucency allowing transmission of light from the light emitting element 4 and having light resistance such that the sealing member 6 is hardly degraded by the light. Specific examples of the material may include insulating resin compositions having translucency allowing transmission of light from the light emitting element, such as silicone resin compositions, modified silicone resin compositions, modified epoxy resin compositions and fluororesin compositions. Particularly, a hybrid resin containing at least one resin having a siloxane backbone as a base, such as dimethyl silicone, phenyl silicone having a low phenyl content, a fluorine-based silicone resin, or the like can also be preferably used.

The method for forming the sealing member 6 is not particularly limited. When the sealing member 6 is a resin, a potting (dropping) method, a compression molding method, a printing method, a transfer molding method, a jet dispersing method, spray coating or the like can be used. In the case of the substrate 3 having a recess portion as in FIG. 1, a potting method is preferred, and when the flat plate-shaped substrate 3 is used, a compression molding method and a transfer molding method are preferred.

The shape of the outer surface of the sealing member 6 is not particularly limited, and may be variously selected according to a light distribution characteristic required for the light emitting device 10. Also, for example, when the upper surface is convex lens-shaped, concave lens-shaped, Fresnel lens-shaped or roughened, directional characteristics and light extraction efficiency can be adjusted.

A colorant, a light diffusing agent, a light reflecting material, various kinds of fillers, a wavelength conversion member and the like can also be included in the sealing member 6.

The wavelength conversion member is a material that subjects light of the light emitting element 4 to wavelength conversion. When light emitted from the light emitting element 4 is blue light, an yttrium-aluminum-garnet-based phosphor (hereinafter, referred to as "YAG:Ce"), a kind of aluminum oxide-based phosphors, is suitably used as the wavelength conversion member. The YAG:Ce phosphor, depending on the content thereof, absorbs a part of light of blue color from the light emitting element, and emits light of yellow color as a complementary color, so that a high-power light emitting device 10 that emits white mixed-color light can be relatively easily formed.

The light emitting device 10 can include various members in addition to those described above. For example, a Zener diode can be mounted as a protective element 8.

EXAMPLES

Figure 5:
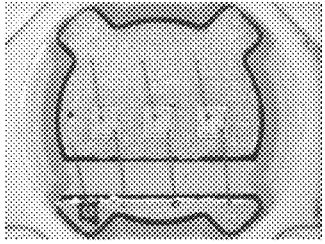
FIG. 5 is a chart showing sulfuration test results for light emitting devices of one embodiment of the present invention and light emitting devices of comparative examples.
Figure 5:
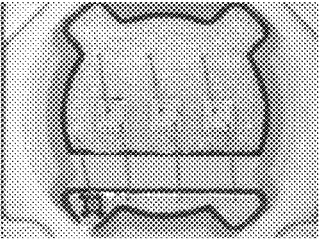
Figure 5:
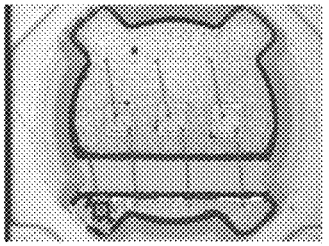
Figure 5:
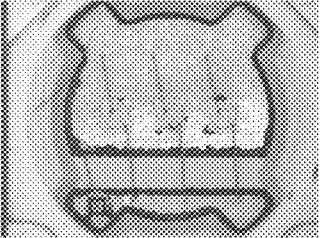
Figure 5:
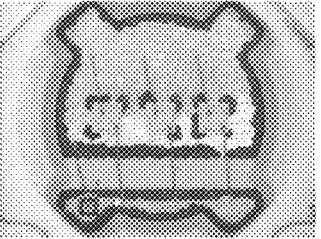
Figure 5:
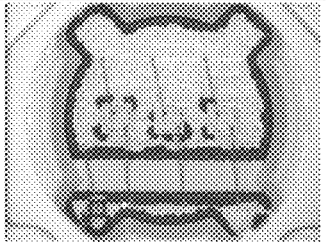
Figure 5:
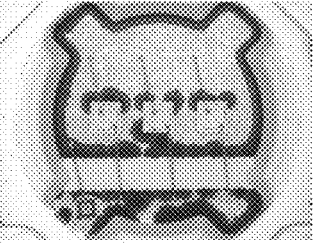
Figure 5:
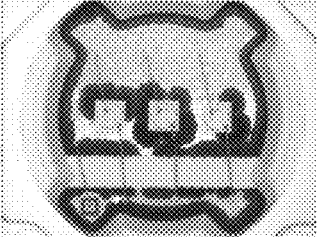
Figure 5:
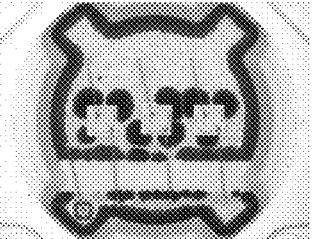
Figure 5:
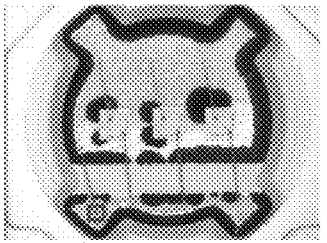

A light emitting device having a structure substantially similar to that of the light emitting device in FIG. 1 was produced as an example. Specifically, as a light reflecting member 1, a pair of lead frames 1 were provided by sequentially forming, on a surface of a Cu base member 1a, Ni in a thickness of 1 μm, Pd in a thickness of 0.03 μm and Au in a thickness of 0.005 μm as an underlayer, and an Ag-containing layer thereon by electroplating. Samples were provided with five different thicknesses of the Ag-containing layer, which are selected within the range of 0.1 μm to 3.0 μm as shown in FIG. 5.

Next, a resin compact 3 with such lead frames 1 each embedded therein as a substrate was formed. It is to be noted that each step may be carried out as an assembly in which a plurality of resin compacts 3 are molded on a lead frame which is in the form of a plurality of coupled pairs of lead frames 1 until the light emitting device 10 is separated into pieces, but explanations are given with a single light emitting device 10 shown in FIG. 1 for the sake of convenience.

The resin compact 3 of this example has a thermosetting epoxy resin composition as a main component, and contains various kinds of additives such as white $TiO_2$. The resin compact 3 has a recess portion, and the light reflecting member 1 is exposed at the bottom surface of the recess portion. On the light reflecting member 1, three light emitting elements 4 including positive/negative electrodes on the upper surface and having a rectangular shape in a plan view were placed with an Au—Sn eutectic as a bonding material 5, and bonded by passing through a reflow step and a washing step. The protective element 8 was mounted with a conductive silver paste as the bonding member 5, and bonded by passing through a curing step.

Then, the light emitting elements 4, the protective element 8 and the light reflecting member 1 were electrically connected using Au wires 7 respectively. Thereafter, as a protective film 2, $Al_2O_3$ was formed in a thickness of 17.5 nm by using an atomic layer deposition method. Next, the inside of the recess portion of the resin compact 3 was filled with a light transmissive dimethyl silicone resin as a sealing member 6, and the resin was heated and cured. Thereafter, the lead frame was cut into pieces to obtain to singulate the light emitting devices 10.

Experiment 1

Each groups of a plurality of light emitting devices 10 thus produced were stored for test at 100° C. for 168 hours in a gas which at least contains $S_8$ with an amount of about 12 ppm.

FIG. 5 shows enlarged pictures of the recess portion and its neighborhood in the light emitting device after the test. For each example and comparative example, two pictures of the light emitting device are shown as A and B.

As is apparent from FIG. 5, in both the light emitting devices of Examples 1 and 2, sulfuration slightly occurred to cause discoloration near the boundary between the resin compact and the light reflecting member, but sulfuration hardly expanded toward the center of the recess portion. In the vicinity of the light emitting element 4, sulfuration hardly occurred although slight discoloration was observed. However, in the light emitting devices of Comparative Examples 1, 2 and 3, sulfuration and discoloration occurred extensively at the boundary between the resin compact 3 and the light reflecting member 1 and in the vicinity of the light emitting element 4.

Experiment 2

A plurality of light emitting devices 10 substantially similar to those in Experiment 1 were produced except that a YAG phosphor was included in the sealing member 6 to provide the light emitting devices 10 capable of emitting white light, and the light emitting devices 10 thus produced were each stored at 100° C. for 672 hours in a gas containing at least $S_8$ in an amount of about 12 ppm.

FIG. 6 shows results of measurement of a luminous flux before the test, a luminous flux after the test, and a ratio of luminous flux between before and after the test (luminous flux retention rate). Sulfuration and discoloration are reduced as the luminous flux retention rate increases.

The light emitting devices 10 of Examples 1 and 2 had the luminous flux retention rate of about 77 to 80%. Disconnection of the wire 7 did not occur. On the other hand, in both the light emitting devices of Comparative Examples 1 and 2, breakage of the wire occurred due to sulfuration, so that light was no longer emitted. In Comparative Example 3, disconnection of the wires 7 was experienced in several light emitting devices, and the light emitting devices in which did not experience disconnection of the wires 7 had the luminous flux retention rate of only about 53%. In the light emitting device of Comparative Example 4, disconnection of wires did not occur, but the luminous flux retention rate was only about 50%. The light emitting devices of Comparative Examples 3 and 4 had a lower luminous flux retention rate as compared to Examples 1 and 2.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a light emitting element;
   a light reflecting member comprising an Ag-containing layer disposed at a top side of the light reflecting member, such that an upper surface of the Ag-containing layer constitutes an uppermost surface of the light reflecting member;
   a resin compact formed over the light reflecting member, wherein the resin compact defines a recess;
   a protective film having a thickness of 1 nm to 300 nm and covering, in a continuous manner, a surface of the resin compact, a surface of the light reflecting member, and a surface of the light emitting element; and
   a sealing member that fills the recess and covers the protective film,
   wherein the Ag-containing layer has a thickness in a range of 0.1 μm to 0.5 μm.

2. The light emitting device according to claim 1, further comprising a wire connecting the light emitting element and the light reflecting member, wherein a material of the wire is Ag or an Ag alloy.

3. The light emitting device according to claim 1, further comprising a wire connecting the light emitting element and the light reflecting member, wherein the protective film further covers, in a continuous manner, a surface of the wire.

4. The light emitting device according to claim 1, wherein the Ag-containing layer contains a brightening agent.

5. The light emitting device according to claim 1, wherein an amount of Ag in the Ag-containing layer is in a range of 70-99%.

6. The light emitting device according to claim 1, wherein the light emitting element is bonded to the light reflecting member.

7. The light emitting device according to claim 6, wherein the light emitting element is bonded to the light reflecting member via a bonding member.

8. The light emitting device according to claim 7, wherein the bonding member comprises a material selected from the group consisting of a conductive paste made of silver, gold, or palladium; or a eutectic solder material made of Au—Sn, or Sn—Ag—Cu.

9. The light emitting device according to claim 6, further comprising at least one additional light emitting element that is bonded to the light reflecting member.

10. The light emitting device according to claim 1, wherein a thickness of the protective film is in a range of 5 nm to 100 nm.

11. A light emitting device comprising:
a light emitting element;
a light reflecting member comprising an Ag-containing layer disposed at a top side of the light reflecting member, such that an upper surface of the Ag-containing layer constitutes an uppermost surface of the light reflecting member;
a resin compact formed over the light reflecting member, wherein the resin compact defines a recess;
a protective film formed by using an atomic layer deposition method, the protective film covering, in a continuous manner, a surface of the resin compact, a surface of the light reflecting member, and a surface of the light emitting element; and
a sealing member that fills the recess and covers the protective film,
wherein the Ag-containing layer has a thickness in a range of 0.1 μm to 0.5 μm.

12. The light emitting device according to claim 11, further comprising a wire connecting the light emitting element and the light reflecting member, wherein a material of the wire is Ag or an Ag alloy.

13. The light emitting device according to claim 11, further comprising a wire connecting the light emitting element and the light reflecting member, wherein the protective film further covers, in a continuous manner, a surface of the wire.

14. The light emitting device according to claim 11, wherein the protective film has a thickness of approximately 1 nm to 300 nm.

15. The light emitting device according to claim 11, wherein the Ag-containing layer contains a brightening agent.

16. The light emitting device according to claim 11, wherein an amount of Ag in the Ag-containing layer is in a range of 70-99%.

17. The light emitting device according to claim 11, wherein the light emitting element is bonded to the light reflecting member.

18. The light emitting device according to claim 17, wherein the light emitting element is bonded to the light reflecting member via a bonding member.

19. The light emitting device according to claim 17, further comprising at least one additional light emitting element that is bonded to the light reflecting member.

20. The light emitting device according to claim 11, wherein a thickness of the protective film is in a range of 5 nm to 100 nm.

* * * * *